United States Patent [19]

White, Jr. et al.

[11] 4,401,904

[45] Aug. 30, 1983

[54] DELAY CIRCUIT USED IN SEMICONDUCTOR MEMORY DEVICE

[75] Inventors: Lionel S. White, Jr.; Ngai H. Hong, both of Houston, Tex.

[73] Assignee: Texas Instruments Incorporated, Dallas, Tex.

[21] Appl. No.: 132,927

[22] Filed: Mar. 24, 1980

[51] Int. Cl.³ .............................................. H03K 5/13
[52] U.S. Cl. ................................. 307/482; 307/578; 307/601; 307/607
[58] Field of Search ............... 307/482, 578, 601, 605, 307/606, 607

[56] References Cited

U.S. PATENT DOCUMENTS

| | | |
|---|---|---|
| 3,629,618 | 12/1971 | Fujimoto ............................ 307/482 |
| 3,665,422 | 5/1972 | McCoy et al. ...................... 307/279 |
| 3,903,431 | 9/1975 | Heeren ............................... 307/482 |
| 3,959,781 | 5/1976 | Mehta et al. ....................... 307/605 |
| 4,276,487 | 6/1981 | Arzubi et al. ...................... 307/270 |

Primary Examiner—Bruce Y. Arnold
Attorney, Agent, or Firm—John G. Graham

[57] ABSTRACT

A random access read/write MOS memory device or the like employs a delay circuit in clock generators to produce small increments of delay. The delay circuit consists of a field effect transistor connected as a transfer device with its gate precharged and the gate-to-source capacitance much larger than the parasitics of the gate node. A larger transistor may be connected to the output node to improve the output waveform by holding down the output voltage at the beginning of a cycle.

6 Claims, 4 Drawing Figures

DELAY CIRCUIT USED IN SEMICONDUCTOR MEMORY DEVICE

BACKGROUND OF THE INVENTION

This invention relates to semiconductor circuits and more particularly to a delay circuit of the type used in clock generators in semiconductor memory devices or the like.

In semiconductor memory devices of the type described in Electronics, Sept. 26, 1978, pp. 109+, or pending application Ser. No. 944822, now U.S. Pat. No. 4,239,993, assigned to Texas Instruments, it is necessary to employ a number of delay circuits in the clock generators to produce clock voltages having a variety of different increments of delay. Usually a stage of amplification is used to create an increment of delay. Here the delay is reliable and tracks well, but the delay increment of one stage of amplification is relatively large, eight to ten nanoseconds for typical device construction. Alternatively, a clock signal can be passed through two separate amplifier stages with one amplifier having more delay than the other, producing two signals differing in time by an increment which can be much less than eight nanoseconds, but this method is critically dependent on device layout and process control to allow the two paths to track.

It is therefore the principal object of this invention to provide an improved delay circuit, particularly one that produces small increments of delay. Another object is to provide a reliable delay circuit which may be used in clock generators for high speed memory devices, or the like.

SUMMARY OF THE INVENTION

In accordance with an embodiment of the invention, a delay stage employs a field effect transistor connected as a transfer device with its gate precharged and the gate-to-source capacitance much larger than the parasitics of the gate node. A larger transistor may be connected to the output node to improve the output waveform by holding down the output voltage at the beginning of a cycle.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
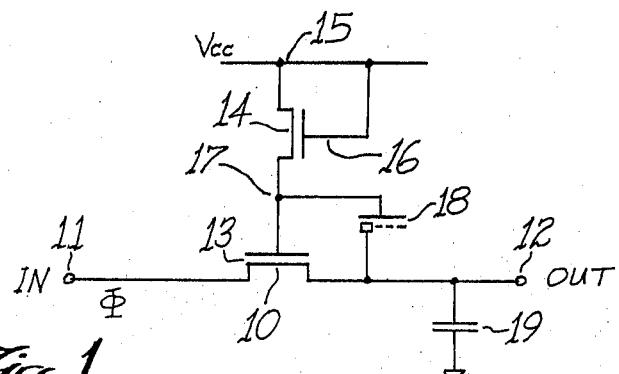
FIG. 1 is an electrical schematic diagram of a delay circuit according to the invention.

With reference to FIG. 1, a circuit for producing a small increment of delay is illustrated according to the invention. The circuit consists of a transistor 10 having one end of its source-to-drain path forming an input node 11 and the other end forming an output node 12. The gate 13 of the transistor 10 is connected through the source-drain path of a transistor 14 to a supply voltage line 15. The gate 16 of the transistor 14 is also connected to the supply line 15. A node 17 is precharged to a voltage Vcc-Vt by this transistor 14. An MOS capacitor 18 connected between the gate 17 and the node 12, functions to keep the gate-to-source voltage of the transistor 10 constant. If the transistor 10 is large enough such that the gate capacitance of the transistor is much larger than the parasitic capacitances associated with the node 17, then the capacitor 18 is unnecessary. A capacitor 19 represents the capacitive load associated with the node 12. The circuit is analagous to an RC ladder network where R is replaced by a transistor; in this case the transistor appears as a resistor of constant resistance.

Figure 2:
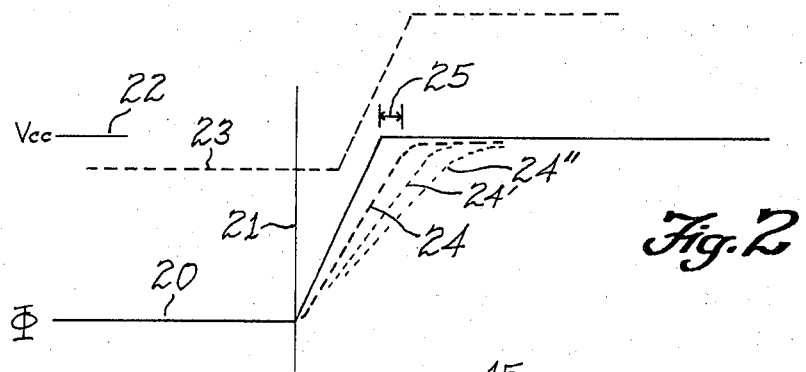
FIG. 2 is a graphic representation of voltage vs. time for voltages appearing in the circuit of FIG. 1.

Referring to FIG. 2, the voltage Φ on the input node 11 is represented by a line 20 which at time 21 starts toward Vcc level 22. The voltage on the node 17 is represented by a line 23; prior to time 21 the node 17 is precharged to a level which is one Vt down from Vcc level 22. As the output node charges up as seen by a line 24, the node 17 is booted to a level higher than Vcc, so the gate voltage of the transistor 10 goes high enough to provide virtually no voltage drop and the output will charge to a level almost equal to the input level. The delay 25 introduced is about two nanoseconds, much less than that introduced by a typical amplifier stage which would be about eight nanoseconds. By connecting several of these circuits in series, increments of 2 ns delay are obtained.

The output voltage 24 is only slightly degraded from the input waveform 20. However, when ganged in series, the outputs 24', 24", etc., for successive stages are degraded more and more for each additional stage. About three stages would be an upper limit with the output waveshape still of reasonably useful form.

Figure 3:
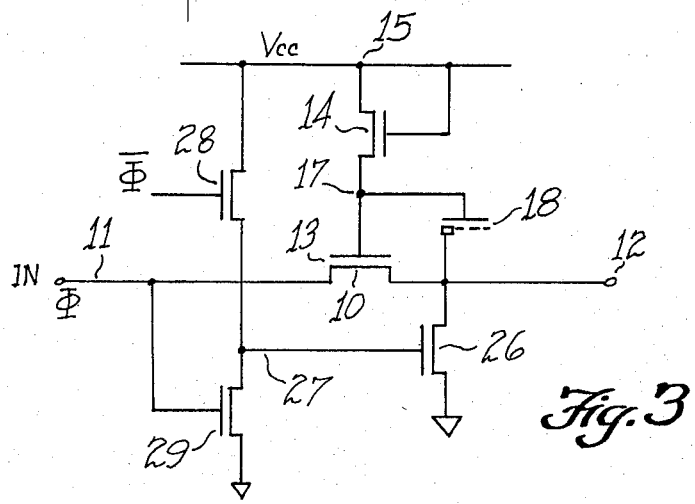
FIG. 3 is an electrical diagram of another embodiment.
Figure 4:
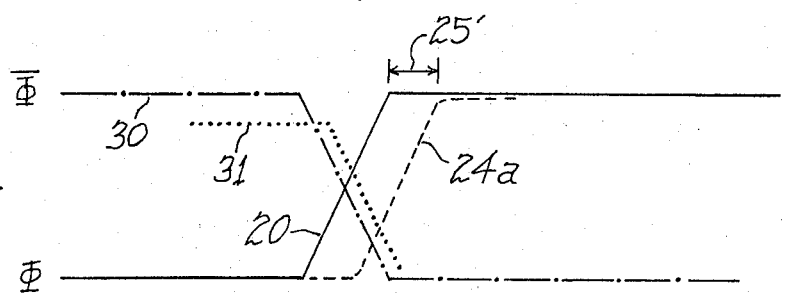
FIG. 4 is a graphic representation of voltage vs. time for voltages appearing in the circuit of FIG. 3.

In order to maintain a good waveform, the modified circuit of FIG. 3 may be employed. A transistor 26 connects the output node 12 to ground. The gate of this transistor is connected to a node 27 which is precharged to near Vcc on $\overline{\Phi}$ by transistor 28. The node 27 is connected to ground by a transistor 29 having the Φ input on its gate. The transistor 26 is much larger in size than the transistor 10, so the voltage drop across the combination is mostly across transistor 10 when both are on. The transistor 26 prevents the output node 12 from rising until the node 27 is discharged, as illustrated in FIG. 4. The $\overline{\Phi}$ voltage is shown as a line 30, and the voltage on the node 27 is shown as a line 31. The delay 25 is longer than that of the circuit of FIG. 1, because the output does not begin to rise until later as seen by the line 24a. When Φ (line 20) reaches a level of one Vt, the transistor 29 turns on, node 27 discharges, 26 turns off, so the output charges.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A delay circuit for providing a small increment of delay comprising: a series insulated-gate field-effect transistor having a source-to-drain current path and a gate electrode, the current path of said series transistor being connected in series between an input terminal and an output terminal; a precharge circuit having an insulated-gate field-effect transistor for precharging said gate electrode of said series transistor to a voltage level, said precharge transistor having a source-to-drain current path and a gate, said gate electrode of the series transistor being connected to a constant supply voltage through the source-to-drain path of the precharge transistor; means for applying an input voltage to the input terminal, the input voltage having a given transition from one level to another; a capacitance means connected between said output terminal and said gate electrode of the series transistor, the capacitance means being much larger than the inherent parasitic capacitance at the gate electrode of the series transistor and functioning for boosting the voltage on said gate electrode of the series transistor at said given transition by coupling from the output terminal to the gate electrode of the series transistor; wherein the primary electrical path between said input terminal and said output terminal for generating an output representation of said given transition is via said source-to-drain path of said series transistor, and wherein a third transistor connects said output terminal to ground, the third transistor having a gate connected to a precharge circuit to be precharged prior to said transition in order to hold the output terminal at ground at the beginning of said given transistion.

2. A circuit according to claim 1 wherein the width to length ratio of said third transistor is greater than that of said series transistor.

3. A circuit according to claim 2 wherein said precharge circuit includes a pair of transistors having source-to-drain paths connected in series between a supply voltage and ground and having gates connected to said input voltage and its complement.

4. A circuit according to claim 3 wherein there is provided means to hold the gate of said precharge transistor at a high level until after said transition occurs, after which such gate potential then goes to ground level.

5. A circuit according to claim 4 wherein all said transistors are N-channel insulated gate field effect transistors.

6. A circuit according to claim 5 wherein said transition is from a level of about ground to a positive supply voltage level.

* * * * *